(12) United States Patent
Lee et al.

(10) Patent No.: US 12,295,267 B2
(45) Date of Patent: May 6, 2025

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Bi-Shen Lee, Hsinchu (TW); Hai-Dang Trinh, Hsinchu (TW); Hsun-Chung Kuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 375 days.

(21) Appl. No.: 17/733,564

(22) Filed: Apr. 29, 2022

(65) Prior Publication Data

US 2023/0354717 A1    Nov. 2, 2023

(51) Int. Cl.
*H10N 50/80* (2023.01)
*H10B 61/00* (2023.01)
*H10N 50/01* (2023.01)

(52) U.S. Cl.
CPC .............. *H10N 50/80* (2023.02); *H10B 61/22* (2023.02); *H10N 50/01* (2023.02)

(58) Field of Classification Search
CPC ........ H10N 50/80; H10N 50/01; H10N 50/10; H10B 61/22
See application file for complete search history.

(56) References Cited

U.S. PATENT DOCUMENTS

| | | | |
|---|---|---|---|
| 5,801,094 A * | 9/1998 | Yew ................. | H01L 21/76804 438/740 |
| 7,704,869 B2 * | 4/2010 | La Tulipe, Jr. ....... | H01L 23/481 438/618 |
| 10,636,961 B2 * | 4/2020 | Chuang ................. | H10N 50/10 |
| 10,991,876 B2 * | 4/2021 | Wu ........................ | H10B 61/22 |
| 2019/0043795 A1 * | 2/2019 | Chen ..................... | H01L 23/498 |
| 2020/0035908 A1 * | 1/2020 | Ku .......................... | H01F 41/34 |
| 2021/0050252 A1 * | 2/2021 | Zhang ............... | H01L 21/76807 |
| 2021/0134988 A1 * | 5/2021 | Kuo .................... | H01L 29/7371 |
| 2021/0375670 A1 * | 12/2021 | Zhang .............. | H01L 21/76831 |
| 2022/0392800 A1 * | 12/2022 | Lim ................. | H01L 21/823468 |

\* cited by examiner

*Primary Examiner* — J. E. Schoenholtz
*Assistant Examiner* — Joe Schoenholtz
(74) *Attorney, Agent, or Firm* — WPAT LAW; Anthony King

(57) ABSTRACT

A semiconductor device and method of manufacturing the same are provided. The semiconductor device includes a substrate, a first dielectric layer, an etching stop layer, a second dielectric layer, a conductive via, and a data storage structure. The first dielectric layer is disposed on the substrate. The etching stop layer is disposed on the first dielectric layer. The second dielectric layer is disposed on the etching stop layer. The first dielectric layer, the etching stop layer, and the second dielectric layer collectively define an opening. The conductive via is disposed in the opening. The data storage structure is disposed on the conductive via.

20 Claims, 18 Drawing Sheets

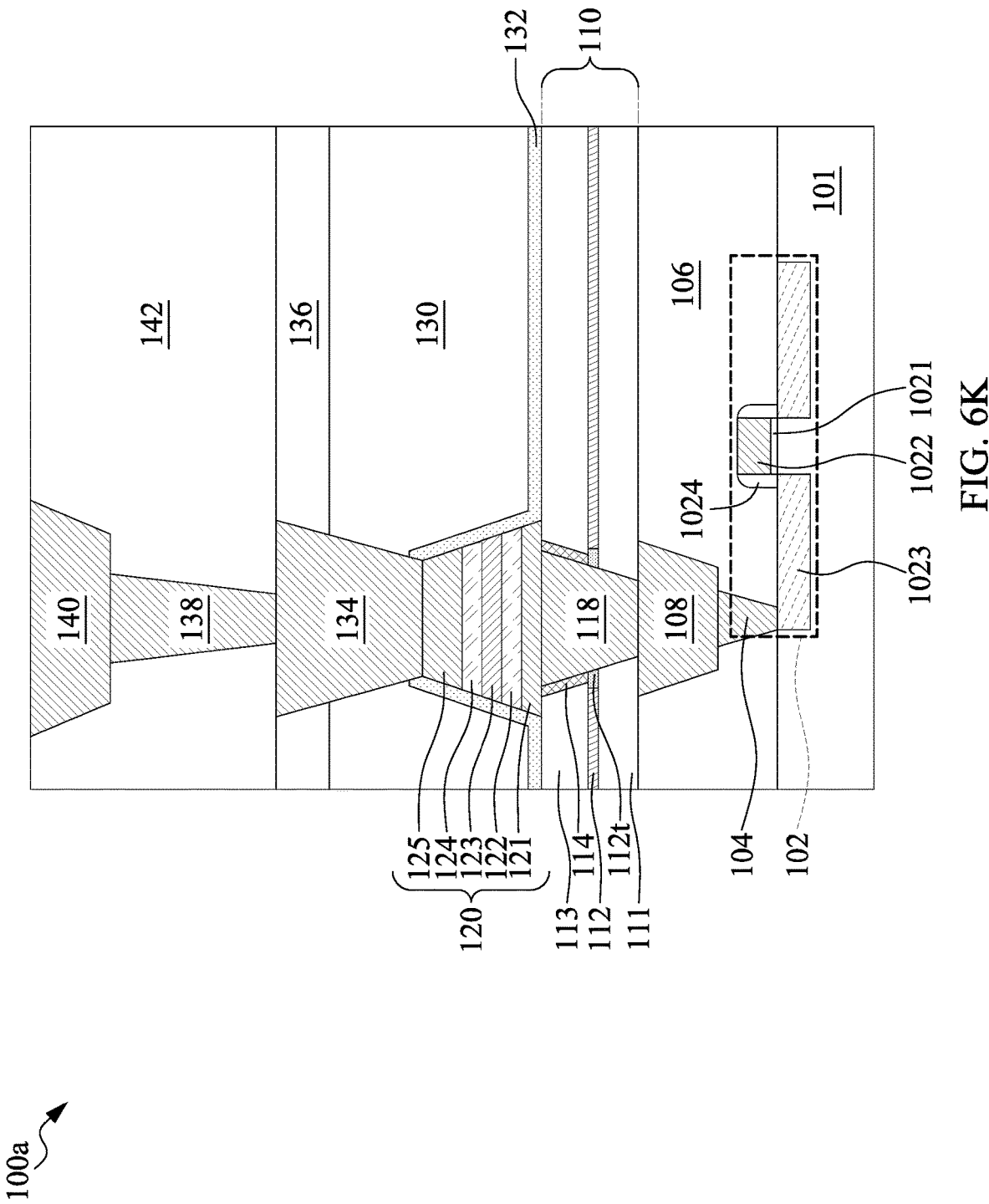

SEMICONDUCTOR DEVICE AND METHOD OF MANUFACTURING THE SAME

BACKGROUND

Technological evolution of integrated circuit (IC) materials and design have resulted in each generation providing smaller and more complex circuits. In the course of such IC evolution, functional density (i.e., the number of interconnected devices per chip area) has generally increased while geometric size (i.e., the smallest component (or line) that may be created using a fabrication process)) has decreased. This scaling down provides benefits of increased production efficiency and lower associated costs.

The noted scaling down has further increased the complexity of IC manufacture, such that for the advances to be fully realized, corresponding developments in IC manufacture are needed.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 6A, FIG. 6B, FIG. 6C, FIG. 6D, FIG. 6E, FIG. 6F, FIG. 6G, FIG. 6H, FIG. 6I, FIG. 6J, and FIG. 6K illustrate various stages of manufacturing a semiconductor device, in accordance with some embodiments of the present disclosure.

DETAILED DESCRIPTION

Figure 1:
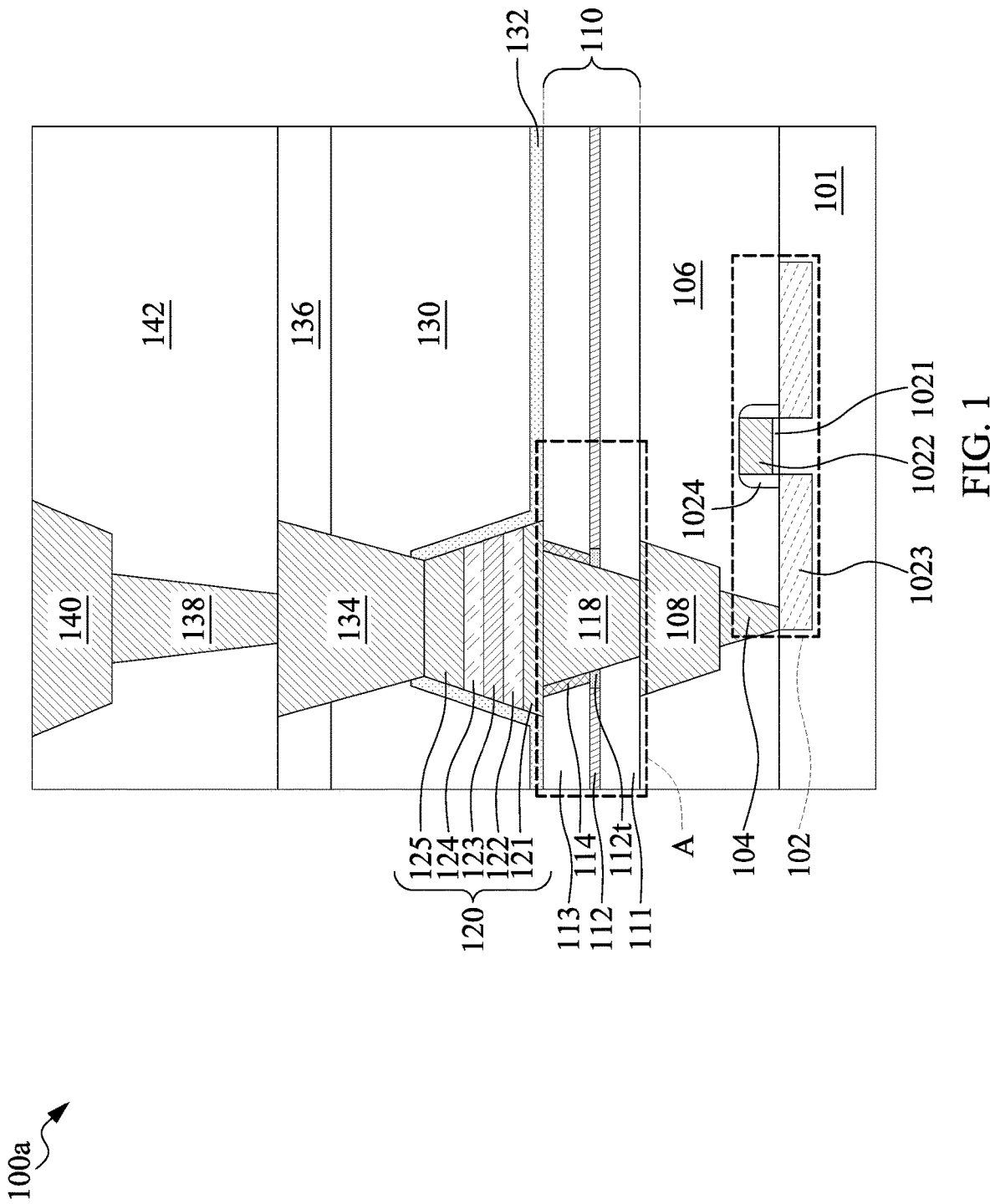
FIG. 1 is a cross-sectional view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a cross-sectional view of a semiconductor device 100a, in accordance with some embodiments of the present disclosure.

The semiconductor device 100a includes a substrate 101. In some embodiments, the substrate 101 is a semiconductor substrate, such as a bulk semiconductor substrate, a semiconductor-on-insulator (SOI) substrate, or the like, which may be doped (e.g., with a p-type or an n-type dopant) or undoped. The substrate 101 may be a semiconductor wafer, such as a silicon wafer. Generally, an SOI substrate includes a layer of a semiconductor material (e.g., silicon) formed on an insulator layer. The insulator layer may be, for example, a buried oxide (BOX) layer, a silicon oxide layer, or the like. The insulator layer is provided on a substrate, typically silicon or glass substrate. Other substrates, such as a multilayered or gradient substrate may also be used. In some embodiments, the semiconductor material of the substrate 101 may include silicon, germanium, a compound semiconductor including silicon carbide (SiC), gallium arsenic (GaAs), gallium phosphide (GaP), indium phosphide (InP), indium arsenide (InAs), and/or indium antimonide (InSb), an alloy semiconductor including SiGe, GaAsP, AlInAs, AlGaAs, GaInAs, GaInP, and/or GaInAsP, or combinations thereof.

Depending on design requirements, the substrate 101 may be a P-type substrate, an N-type substrate, or a combination thereof and may have doped regions therein. The substrate 101 may be configured for an NMOS device, a PMOS device, an N-type FinFET device, a P-type FinFET device, other kinds of devices (such as, multiple-gate transistors, gate-all-around transistors or nanowire transistors), or combinations thereof. In some embodiments, the substrate 101 for NMOS device or N-type FinFET device may include Si, SiP, SiC, SiPC, InP, GaAs, AlAs, InAs, InAlAs, InGaAs, or combinations thereof. The substrate 101 for PMOS device or P-type FinFET device may include Si, SiGe, SiGeB, Ge, InSb, GaSb, InGaSb, or combinations thereof.

The semiconductor device 100a includes a dielectric layer 106. The dielectric layer 106 may also be referred to as "first inter-level dielectric (ILD) layer." The dielectric layer 106 may include silicon oxide, carbon-containing oxide such as silicon oxycarbide (SiOC), silicate glass, tetraethylorthosilicate (TEOS) oxide, undoped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 106 may include low-k dielectric material with a dielectric constant lower than 4, or extreme low-k (ELK) dielectric material with a dielectric constant lower than 2.5. In some embodiments, the low-k material includes a polymer based material, such as benzocyclobutene (BCB); or a silicon dioxide based material, such as hydrogen silsesquioxane (HSQ) or SiOF. The dielectric layer 106 may be a single layer structure or a multi-layer structure.

The semiconductor device 100a includes a transistor 102. The transistor 102 is disposed within the substrate 101 and the dielectric layer 106. The transistor 102 includes a gate dielectric 1021, a gate electrode 1022, and source/drain regions (S/D regions) 1023.

The gate dielectric 1021 may include silicon oxide, silicon nitride, silicon oxynitride, high-k dielectric materials, or combinations thereof. The high-k material may have a dielectric constant ranging from about 4 to about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, the gate dielectric 1021 may optionally include a silicate such as HfSiO, LaSiO, AlSiO, a combination thereof, or a suitable material.

The gate electrode 1022 is disposed on the gate dielectric 1021. The gate electrode 1022 may include doped polysilicon, undoped polysilicon, or a metal-containing conductive material. In some embodiments, the gate electrode includes a work function metal layer and a metal filling layer on the work function metal layer. The work function metal layer may be an N-type work function metal layer or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN, conductive metal oxide, and/or a suitable material.

In some embodiments, the S/D regions 1023 may be formed within the substrate 101. The S/D regions 1023 may be formed on opposite sides of the gate electrode 1022. In some embodiments, the S/D regions 1023 are doped regions configured for a PMOS device and include p-type dopants, such as boron, $BF_2^+$, and/or a combination thereof. In alternative embodiments, the S/D regions 1023 are doped regions configured for an NMOS device, and include n-type dopants, such as phosphorus, arsenic, and/or a combination thereof.

The semiconductor device 100a includes spacers 1024. The spacers 1024 may be disposed on opposite sides of the gate dielectric 1021 and the gate electrode 1022. In some embodiments, the spacer 1024 includes a single layer structure or a multilayered structure. The spacer may include silicon nitride (SiN), silicon oxide (SiO), silicon oxynitride (SiON), or other suitable materials.

The semiconductor device 100a includes a conductive contact 104 and an interconnect wire 108 disposed thereon. The conductive contact 104 and the interconnect wire 108 are embedded in the dielectric layer 106. In some embodiments, the conductive contact 104 may comprise tungsten, copper, or the like. In some embodiments, the interconnect wire 108 may comprise aluminum, copper, or the like. The interconnect wire 108 may also be referred to as a lower metal layer conductive via.

The semiconductor device 100a includes a dielectric structure 110. In some embodiments, the dielectric structure 110 is disposed on the dielectric layer 106. In some embodiments, the dielectric structure 110 includes a multilayered structure. In some embodiments, the dielectric structure 110 includes a dielectric layer 111, an etching stop layer 112, a dielectric layer 113, and a liner 114. In some embodiments, the dielectric structure 110 defines an opening for accommodating a conductive via 118.

In some embodiments, the conductive via 118 is disposed within the opening defined by the dielectric structure 110. The conductive via 118 can be electrically connected to the interconnect wire 108. The conductive via 118 may include one or more liners (e.g., a diffusion barrier layer) surrounding a conductive metal (e.g., copper, aluminum, platinum, iridium, ruthenium or tungsten, or the like). The conductive via 118 may also be referred to as a "bottom via 118."

The semiconductor device 100a includes a data storage structure 120. In some embodiments, the data storage structure 120 may include a memory cell, such as a magnetoresistive random-access memory (MRAM) cell, which includes a magnetic tunnel junction (MTJ) structure. The data storage structure 120 is electrically connected to the transistor 102 via the conductive contact 104, the interconnect wire 108, and the conductive via 118. In some embodiments, the data storage structure 120 includes an electrode 121, a ferromagnetic electrode 122, a tunneling barrier layer 123, a ferromagnetic electrode 124, and an electrode 125 stacked in order. The electrode 121 may also be referred to as a "bottom electrode" of the data storage structure 120. The ferromagnetic electrode 122 may also be referred to as a "lower ferromagnetic electrode" of the data storage structure 120. The ferromagnetic electrode 124 may also be referred to as an "upper ferromagnetic electrode" of the data storage structure 120. The electrode 125 may also be referred to as a "top electrode" of the data storage structure 120.

The electrode 121 is disposed on the conductive via 118. In some embodiments, the electrodes 121 and 125 may include a conductive material, such as, titanium nitride, tantalum nitride, titanium, tantalum, or a combination of one or more of the foregoing.

The ferromagnetic electrodes 122 and 124 are separated by the tunneling barrier layer 123. In some embodiments, the ferromagnetic electrode 122 can have a fixed or pinned magnetic orientation, while the ferromagnetic electrode 124 has a variable or free magnetic orientation, which can be switched between two or more distinct magnetic polarities that each represents a different data state, such as a different binary state. In other implementations, however, the data storage structure 120 can be vertically flipped, such that the lower ferromagnetic electrode has a free magnetic orientation, while the upper ferromagnetic electrode 124 has a pinned magnetic orientation. In some embodiments, the ferromagnetic electrodes 122 may include iron, cobalt, nickel, iron cobalt, nickel cobalt, cobalt iron boride, iron boride, iron platinum, iron palladium, or the like. In some embodiments, the ferromagnetic electrode 124 may include iron, cobalt, nickel, iron cobalt, nickel cobalt, cobalt iron boride, iron boride, iron platinum, iron palladium, or the like.

In some embodiments, the tunneling barrier layer 123 provides electrical isolation between the ferromagnetic electrodes 122 and 124, while still allowing electrons to tunnel through the tunneling barrier layer 123 under proper conditions. The tunneling barrier layer 123 may include, for example, magnesium oxide (MgO), aluminum oxide (e.g., $Al_2O_3$), nickel oxide, gadolinium oxide, tantalum oxide, molybdenum oxide, titanium oxide, tungsten oxide, or the like.

The semiconductor device 100a includes a dielectric layer 130. The dielectric layer 130 may be disposed on the dielectric structure 110. The dielectric layer 130 surrounds the data storage structure 120. In some embodiments, the dielectric layer 130 includes a different material or composition than the dielectric structure 110. The dielectric layer 130 includes silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. The dielectric layer 130 may also be referred to as a "second ILD layer."

The semiconductor device 100a includes a spacer 132. In some embodiments, the spacer 132 may surround the data storage structure 120. In some embodiments, the spacer 132 may be surrounded by the dielectric layer 130. The spacer 132 may disposed on sidewalls of the electrode 121, ferromagnetic electrode 122, tunneling barrier layer 123, ferromagnetic electrode 124, and electrode 125. In some embodiments, the spacer 132 may be disposed on a top surface of the dielectric structure 110. In some embodiments, the spacer 132 may include silicon nitride, silicon oxynitride, or other suitable materials.

The semiconductor device 100a includes an interconnect wire 134. The interconnect wire 134 is disposed directly on the electrode 125. In some embodiments, the interconnect wire 134 may include one or more liners (e.g., a diffusion barrier layer) surrounding a conductive metal (e.g., copper, aluminum) or the like). In some embodiments, the spacer 132 and interconnect wire 134 are surrounded by the dielectric layer 130. The interconnect wire 134 may also be referred to as an upper interconnect wire.

The semiconductor device 100a includes a dielectric layer 136. The dielectric layer 136 is disposed over the dielectric layer 130 and laterally surrounds the interconnect wire 134.

The semiconductor device 100a includes a conductive via 138. The conductive via 138 is disposed over the interconnect wire 134. In some embodiments, the conductive via 138 may be made of copper, aluminum, or the like.

The semiconductor device 100a includes a conductive wire 140. The conductive wire 140 is disposed over the conductive via 138. The conductive wire 140 extends past sidewalls of the conductive via 138. In some embodiments, the conductive wire 140 may be made of copper, aluminum, or the like.

The semiconductor device 100a includes a dielectric layer 142. The dielectric layer 142 surrounds the conductive wire 140 and the conductive via 138. The dielectric layer 130 may also be referred to as a third ILD layer.

Figure 2:
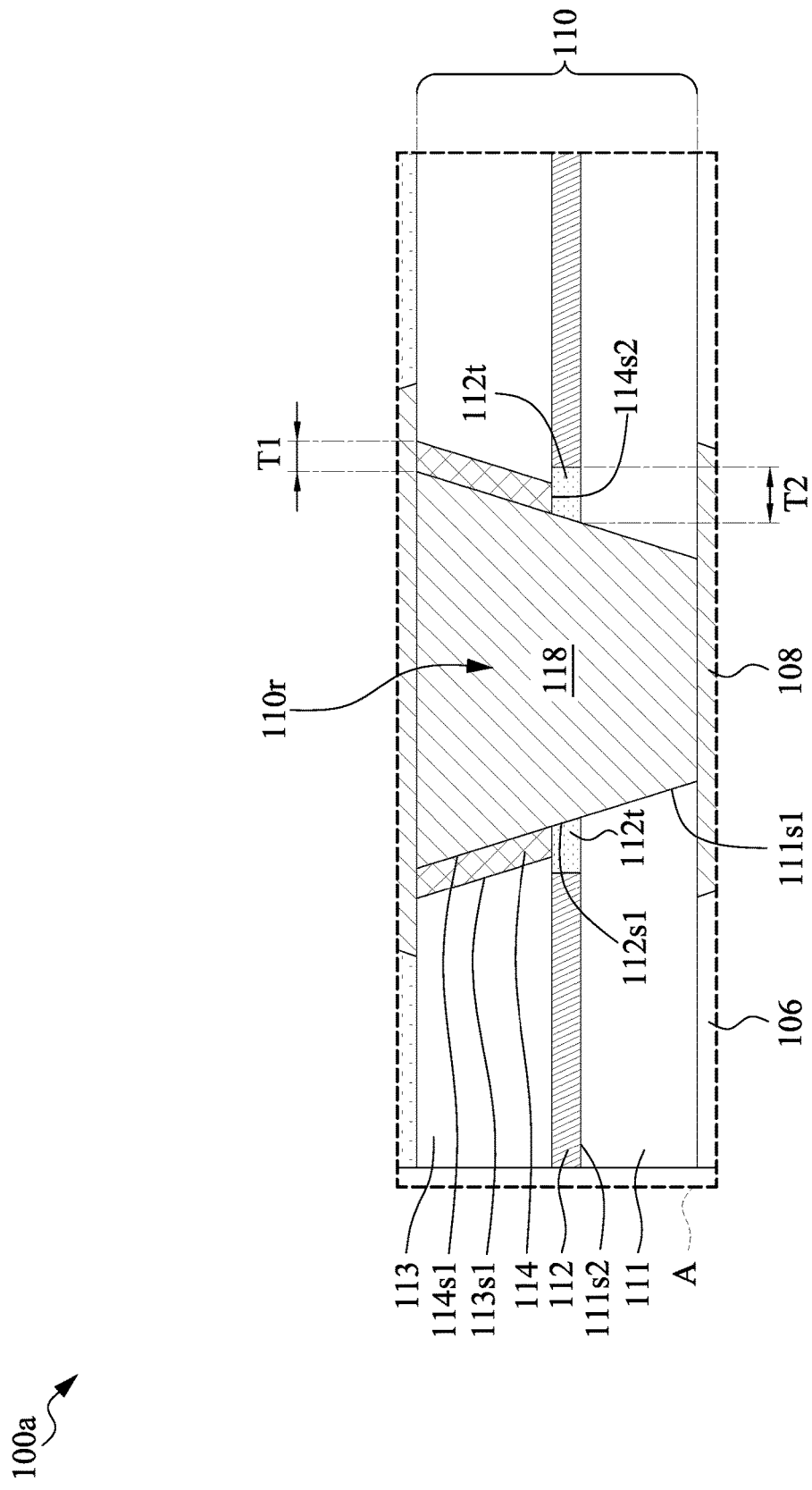
FIG. 2 is an enlarged view of region A of the semiconductor device shown in FIG. 1, in accordance with some embodiments of the present disclosure.

FIG. 2 is an enlarged view of region A of the semiconductor device shown 100a in FIG. 1, in accordance with some embodiments of the present disclosure.

As shown in FIG. 2, the dielectric structure 110 defines an opening 110r within which the conductive via 118 is disposed. The opening 110r can be defined by a sidewall 111s1 of the dielectric layer 111, a sidewall 112s1 of the etching stop layer 112, and a sidewall 114s1 of the liner 114 (or a sidewall 113s1 of the dielectric layer 113). In some embodiments, the opening 110r is tapered along a direction from the dielectric layer 113 toward the dielectric layer 111. In some embodiments, the conductive via 118 is disposed on the sidewall 111s1 of the dielectric layer 111, sidewall 112s1 of the etching stop layer 112, and sidewall 114s1 of the liner 114.

The dielectric layer 111 is disposed on the dielectric layer 106. In some embodiments, the dielectric layer 111 can function as a silicide barrier layer (SBL). In some embodiments, the dielectric layer 111 includes dielectric materials, such as silicon carbide (SiC) or other suitable materials. The dielectric layer 111 may also be referred to as a lower dielectric layer of the dielectric structure 110.

In some embodiments, the etching stop layer 112 disposed on the dielectric layer 111. In some embodiments, the dielectric layer 111 is spaced apart from the dielectric layer 113 by the etching stop layer 112. In some embodiments, the etching stop layer 112 has a thickness of about 0.5 nm to about 30 nm, such as 0.5 nm, 1 nm, 2 nm, 5 nm, 10 nm, 20 nm, or 30 nm. The etching stop layer 112 can be configured to protect the interconnect wire 108 from extrusion during formation of the liner 114, which will be described in detail later. In some embodiments, the etching stop layer 112 includes a halogen-sensitive material. As used herein, the term "halogen-sensitive material" refers to a material which can react with halogen, such as a gas or a solution including fluorine (F), chlorine (Cl), Bromine (Br), iodine (1), a compound thereof, or a combination thereof. The halogen-sensitive material can react with halogen, thereby forming a derivative of the halogen-sensitive material, which has relatively strong resistance to etchants including halogen or a derivative of halogen. As used herein, the aforesaid derivative of the halogen-sensitive material can refer to a material having a boiling point equaling or exceeding 600° C., such as 600° C., 650° C., 700° C., 750° C., 800° C., 850° C., 900° C., 950° C., 1000° C., 1100° C., 1200° C., 1300° C., 1400° C., 1500° C. or more.

In some embodiments, the etching stop layer 112 includes metal oxide, such as aluminum oxide (AlOx), zirconium oxide (ZrO$_x$), hafnium oxide (HfO$_x$), zinc oxide (ZnO$_x$), strontium oxide (SrO$_x$), lanthanum oxide (LaO$_x$), dysprosium oxide (DyO$_x$), yttrium oxide (YO$_x$), gadolinium oxide (GdO$_x$), scandium oxide (ScO$_x$), or other suitable materials. In some embodiments, the etching stop layer 112 includes metal nitride, such as titanium nitride (TiN$_x$), aluminum nitride (AlN$_x$), zirconium nitride (ZrN$_x$), hafnium nitride (HfN$_x$), zinc nitride (ZnN$_x$), strontium nitride (SrN$_x$), lanthanum nitride (LaN$_x$), dysprosium nitride (DyN$_x$), yttrium nitride (YN$_x$), gadolinium nitride (GdN$_x$), scandium nitride (ScN$_x$), or other suitable materials.

In some embodiments, the semiconductor device 100a includes a treated portion 112t of the etching stop layer 112. In some embodiments, the treated portion 112t is exposed by the opening 110r of the dielectric structure 110. In some embodiments, the treated portion 112t is in contact with the conductive via 118. In some embodiments, the treated portion 112t is a derivative of the etching stop layer 112. In some embodiments, the treated portion 112t is formed by a reaction of the etching stop layer 112 and halogen.

In some embodiments, a composition of the treated portion 112t is different from that of the etching stop layer 112. In some embodiments, the treated portion 112t includes a material including halide. In some embodiments, the treated portion 112t of the etching stop layer 112 includes a material including metal halide, such as titanium halide (e.g., TiF$_x$, TiCl$_x$, TiBr$_x$, or TiI$_x$), aluminum halide (e.g., AlF$_x$, AlCl$_x$, AlBr$_x$, or AlI$_x$), zirconium halide (e.g., ZrF$_x$, ZrCl$_x$, ZrBr$_x$, or ZrI$_x$), hafnium halide (e.g., HfF$_x$, HfCl$_x$, HfBr$_x$, or HfI$_x$), zinc halide (e.g., ZnF$_x$, ZnCl$_x$, ZnBr$_x$, or ZnI$_x$), strontium halide (e.g., SrF$_x$, SrCl$_x$, SrBr$_x$, or SrI$_x$), lanthanum halide (e.g., LaF$_x$, LaCl$_x$, LaBr$_x$, or LaI$_x$), dysprosium halide (e.g., DyF$_x$, DyCl$_x$, DyBr$_x$, or DyI$_x$), yttrium halide (e.g., YF$_x$, YCl$_x$, YBr$_x$, or YI$_x$), gadolinium halide (e.g., GdF$_x$, GdCl$_x$, GdBr$_x$, or GdI$_x$), scandium halide (e.g., ScF$_x$, ScCl$_x$, ScBr$_x$, or ScI$_x$), or other suitable materials. In some embodiments, the treated portion 112t of the etching stop layer 112 can have a boiling point equaling or exceeding 600° C., such as 600° C., 650° C., 700° C., 750° C., 800° C., 850° C., 900° C., 950° C., 1000° C., 1100° C., 1200° C., 1300° C., 1400° C., 1500° C. or more.

In some embodiments, the dielectric layer 113 is disposed on the etching stop layer 112. In some embodiments, the dielectric layer 113 is spaced apart from the dielectric layer 111 by the etching stop layer 112. In some embodiments, the dielectric layer 113 is spaced apart from the conductive via 118 by the liner 114. In some embodiments, the dielectric layer 113 can include silicon nitride, tetraethyl orthosilicate (TEOS), silicon-rich oxide (SRO), or a similar composite dielectric film. The dielectric layer 113 may also be referred to as an upper dielectric layer of the dielectric structure 110. The dielectric layer 113 has a sidewall 113s1. In some embodiments, the sidewall 113s1 of the dielectric layer 113 is noncoplanar with the sidewall 111s1 of the dielectric layer 111.

In some embodiments, the liner 114 is disposed on the sidewall 113s1 of the dielectric layer 113. In some embodiments, the liner 114 is disposed on the etching stop layer 112. In some embodiments, the liner 114 is spaced apart from the dielectric layer 111 by the etching stop layer 112. In some embodiments, the sidewall 114s1 of the liner 114 is substantially coplanar with the sidewall 111s1 of the dielectric layer 111. In some embodiments, the sidewall 114s1 of the liner 114 is substantially coplanar with the sidewall 112s1 of the etching stop layer 112. In some embodiments, a surface 114s2 (or a lower surface) of the liner 114 is higher than a surface 111s2 (or an upper surface) of the dielectric layer 111. In some embodiments, the liner 114 is in contact with the conductive via 118. In some embodiments, the liner 114 has a thickness T1 ranging from about 1 nm to about 20 nm, such as 1 nm, 2 nm, 5 nm, 10 nm, or 20 nm. In some embodiments, the liner 114 includes silicon oxide, amorphous silicon, titanium oxide, tantalum pentoxide, or other suitable materials. In some embodiments, a roughness of the sidewall 114s1 of the liner 114 is different from a roughness of the sidewall 112s1 of the etching stop layer 112 (or treated portion 112t).

The treated portion 112t of the etching stop layer 112 has a thickness T2. In some embodiments, the thickness T2 is greater than the thickness T1 along a direction perpendicular to a direction from the dielectric layer 111 toward the dielectric layer 113.

In some other embodiments, the treated portion 112t of the etching stop layer 112 can be removed such that the etching stop layer 112 is in contact with the conductive via 118.

In a comparative example, the upper dielectric layer is disposed on and in contact with the lower dielectric layer. In order to form a liner, an etching process is performed to remove a portion of the upper dielectric layer. Such etching process includes an etchant including halogen, which may etch both the upper dielectric layer and lower dielectric layer. In the comparative example, the lower dielectric layer may also be etched. During formation of the liner, a relatively high temperature may cause an extrusion of the lower metal layer conductive via because of insufficient thickness of the lower dielectric layer, which thereby negatively affects yield. In the embodiments of the present disclosure, an additional etching stop layer (e.g., 112) is formed to separate the lower dielectric layer (e.g., 111) from the upper dielectric layer (e.g., 113), which thereby prevents an extrusion of the lower metal layer conductive via (e.g., 108). Using the etching stop layer 112 may assist in forming a relatively small opening 110r of the dielectric structure 110, which may reduce the size of the semiconductor device 100a.

Figure 3:
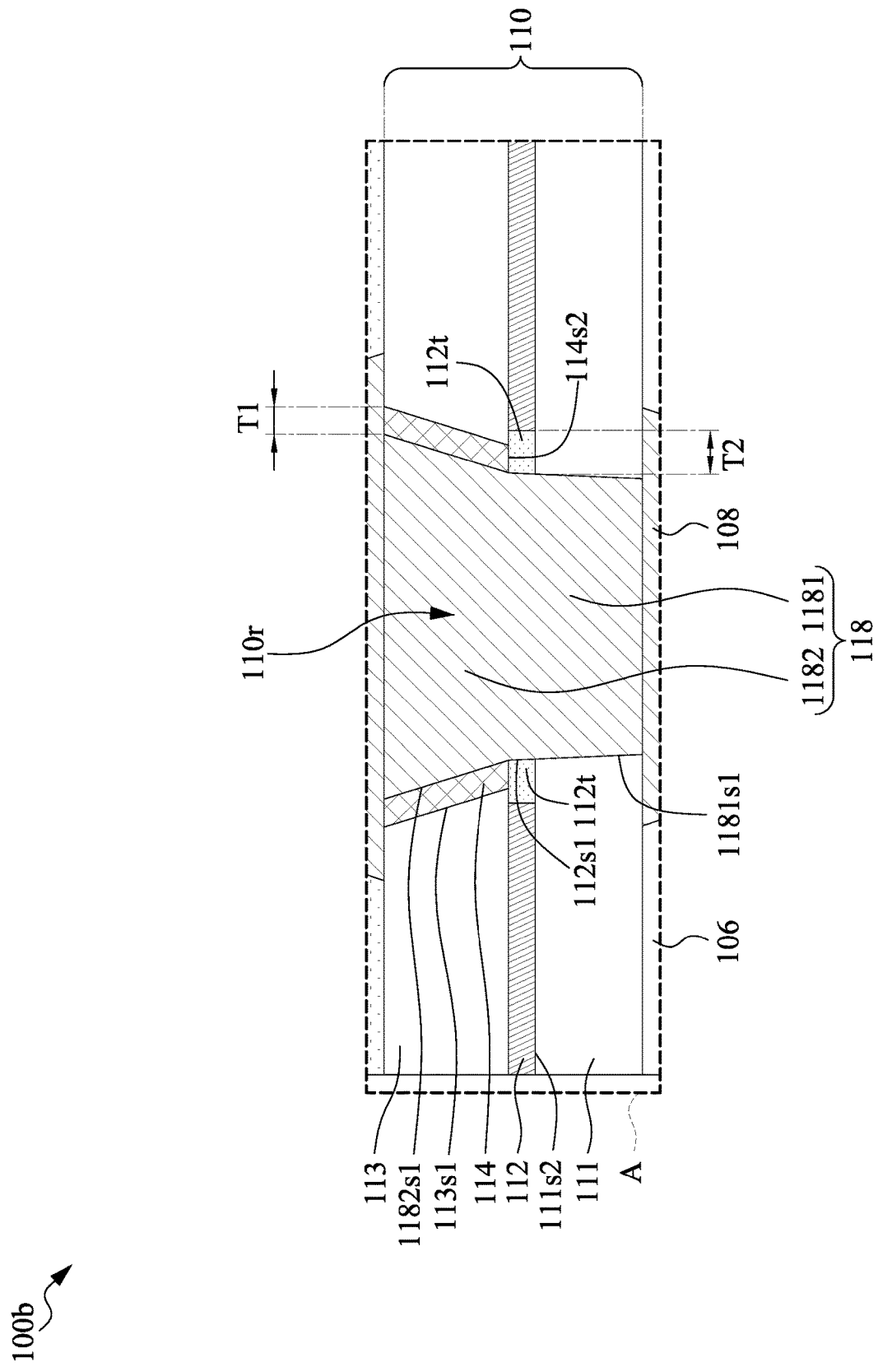
FIG. 3 is a cross-sectional view of a semiconductor device, in accordance with some embodiments of the present disclosure.

FIG. 3 is a cross-sectional view of a semiconductor device 100b, in accordance with some embodiments of the present disclosure. The semiconductor device 100b has a structure similar to that of the semiconductor device 100a. One of the differences between the semiconductor devices 100b and 100a is that the conductive via 118 may have different angles of taper (or taper angles).

In some embodiments, the conductive via 118 may have a lower part 1181 and an upper part 1182 above the lower part 1181. In some embodiments, the lower part 1181 and the upper part 1182 may have different angles of taper. The lower part 1181 has a sidewall 1181s1. The upper part 1182 has a sidewall 1182s1. In some embodiments, the sidewall 1181s1 of the lower part 1181 is noncoplanar with the sidewall 1182s1 of the upper part 1182. In some embodiments, the sidewall 1181s1 of the lower part 1181 is steeper than the sidewall 1182s1 of the upper part 1182. The aperture of the opening 110r may accordingly have different angles of taper corresponding to the lower part 1181 and the upper part 1182. The angle of taper of the sidewall 1181s1 of the lower part 1181 may be defined by the sidewall 112s1 of the etching stop layer 1122 and the sidewall 111s1 of the dielectric layer 111. The angle of taper of the sidewall 1182s1 of the upper part 1182 may be defined by the sidewall 114s1 of the liner 114 (or sidewall 113s1 of the dielectric layer 113).

Figure 4:
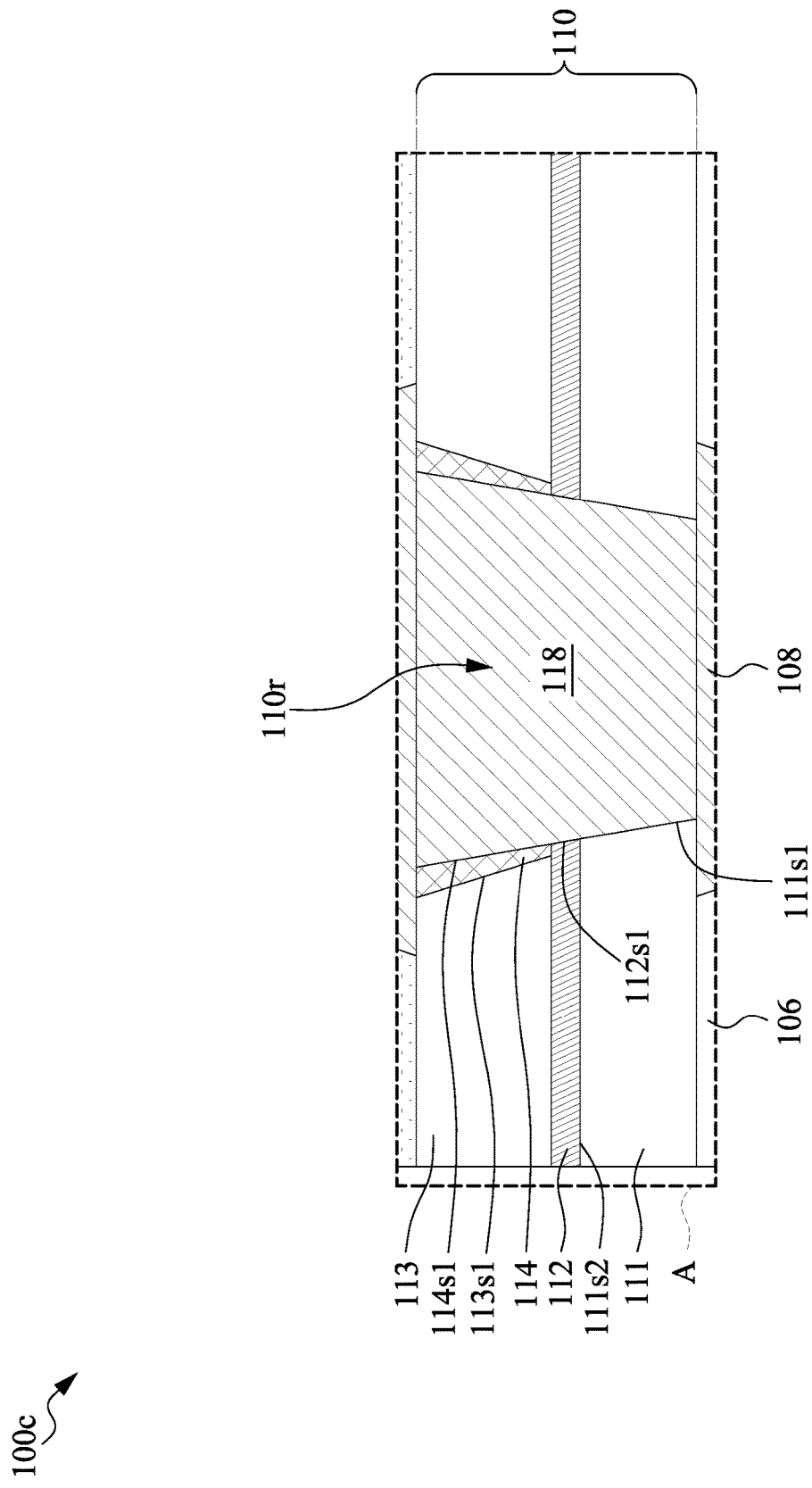
FIG. 4 is a cross-sectional view of a semiconductor device, in accordance with some embodiments of the present disclosure.

FIG. 4 is a cross-sectional view of a semiconductor device 100c, in accordance with some embodiments of the present disclosure. The semiconductor device 100c has a structure similar to that of the semiconductor device 100a. One of the differences between the semiconductor devices 100c and 100a is that the liner 114 may have an uneven thickness.

In some embodiments, the liner 114 may be tapered from the dielectric layer 113 toward the dielectric layer 111. In some embodiments, the sidewall 114s1 of the liner 114 may be not parallel to the sidewall 113s1 of the dielectric layer 113. In some embodiments, the sidewall 113s1 of the dielectric layer 113 may be not parallel to the sidewall 111s1 of the dielectric layer 111.

Figure 5:
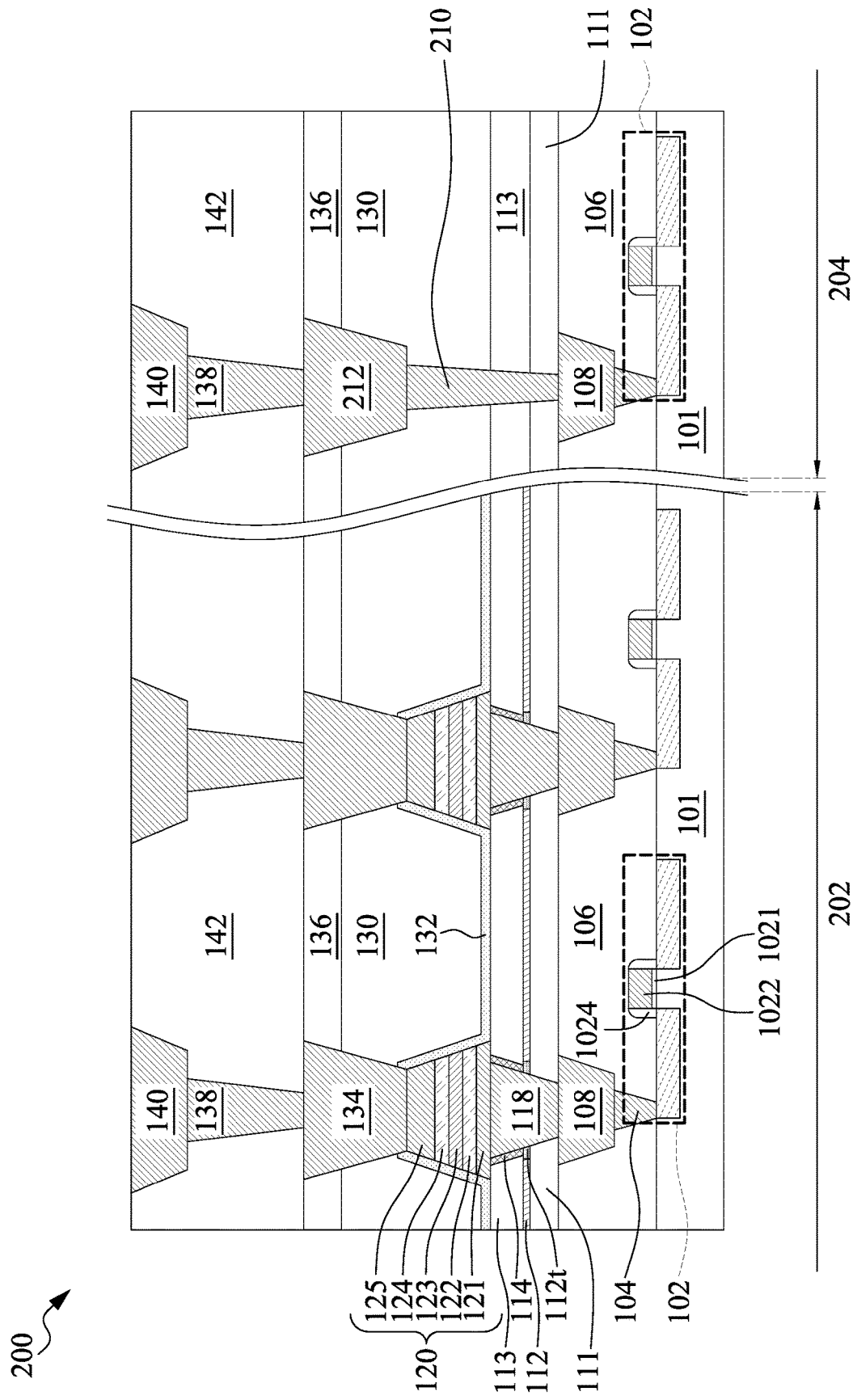
FIG. 5 is a cross-sectional view of a semiconductor device, in accordance with some embodiments of the present disclosure.

FIG. 5 is a cross-sectional view of a semiconductor device 200, in accordance with some embodiments of the present disclosure.

In some embodiments, the semiconductor device 200 may include an embedded memory region 202 and a logic region 204. In some embodiments, the embedded memory region 202 may include a plurality of structures similar to or the same as those shown in FIG. 1, FIG. 3, and/or FIG. 4. The components in the embedded memory region 202 may be similar to those in the logic region 204. In some embodiments, the logic region 204 is free of the data storage structure 120. In some embodiments, the logic region 204 includes a conductive via 210 and an interconnection wire 212.

The conductive via 210 penetrates the dielectric layers 111, 113 and a portion of the dielectric layer 130. The interconnection wire 212 is disposed on the conductive via 210. The interconnection wire 212 may be surrounded by the dielectric layers 130 and 136.

In some embodiments, the logic region 204 is free of etching stop layer 112. In some embodiments, the dielectric layer 111 is in contact with the dielectric layer 113 in the logic region 204.

FIG. 6A, FIG. 6B, FIG. 6C, FIG. 6D, FIG. 6E, FIG. 6F, FIG. 6G, FIG. 6H, FIG. 6I, FIG. 6J, and FIG. 6K illustrate various stages of manufacturing a semiconductor device 100a, in accordance with some embodiments of the present disclosure.

Figure 6A:
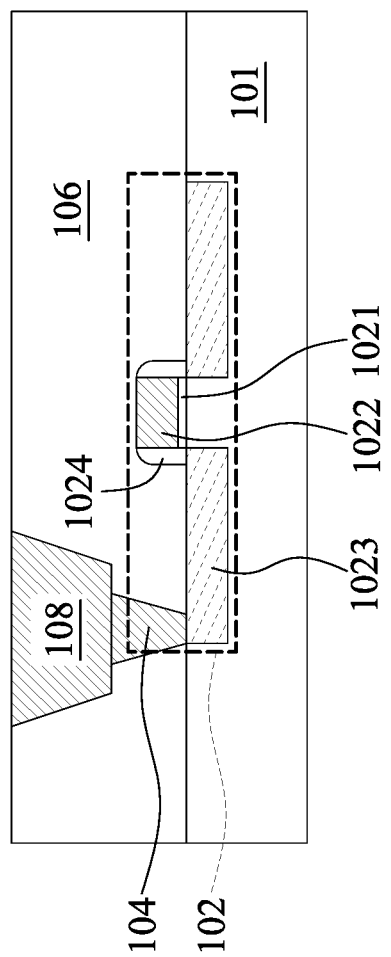

Referring to FIG. 6A, a substrate 101 is provided. A dielectric layer 106 is formed over the substrate 101. A transistor 102 is formed within the substrate 101 and dielectric layer 106. A conductive contact 104 is formed to connect the S/D regions 1023 of the transistor 102. An interconnect wire 108 is formed over the conductive contact 104.

Figure 6B:
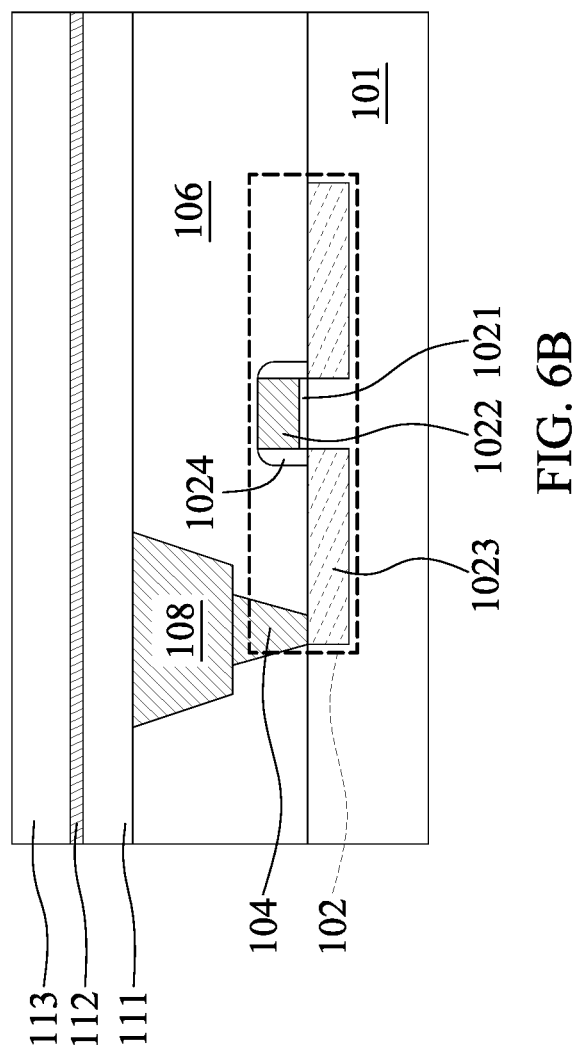

Referring to FIG. 6B, a dielectric layer 111, an etching stop layer 112, and a dielectric layer 113 are formed. In some embodiments, the dielectric layer 111 is formed on the dielectric layer 106. In some embodiments, the etching stop layer 112 is formed on the dielectric layer 111. In some embodiments, the dielectric layer 113 is formed on the etching stop layer 112. Each of the dielectric layer 111, etching stop layer 112, and dielectric layer 113 may be formed by a deposition process, such as chemical vapor deposition (CVD), plasma enhanced CVE (PECVD), flowable CVD (FCVD), physical vapor deposition (PVD), electrochemical plating (ECP), electrodeposition (ELD), atomic layer deposition (ALD), or the like, or combinations thereof.

Figure 6C:
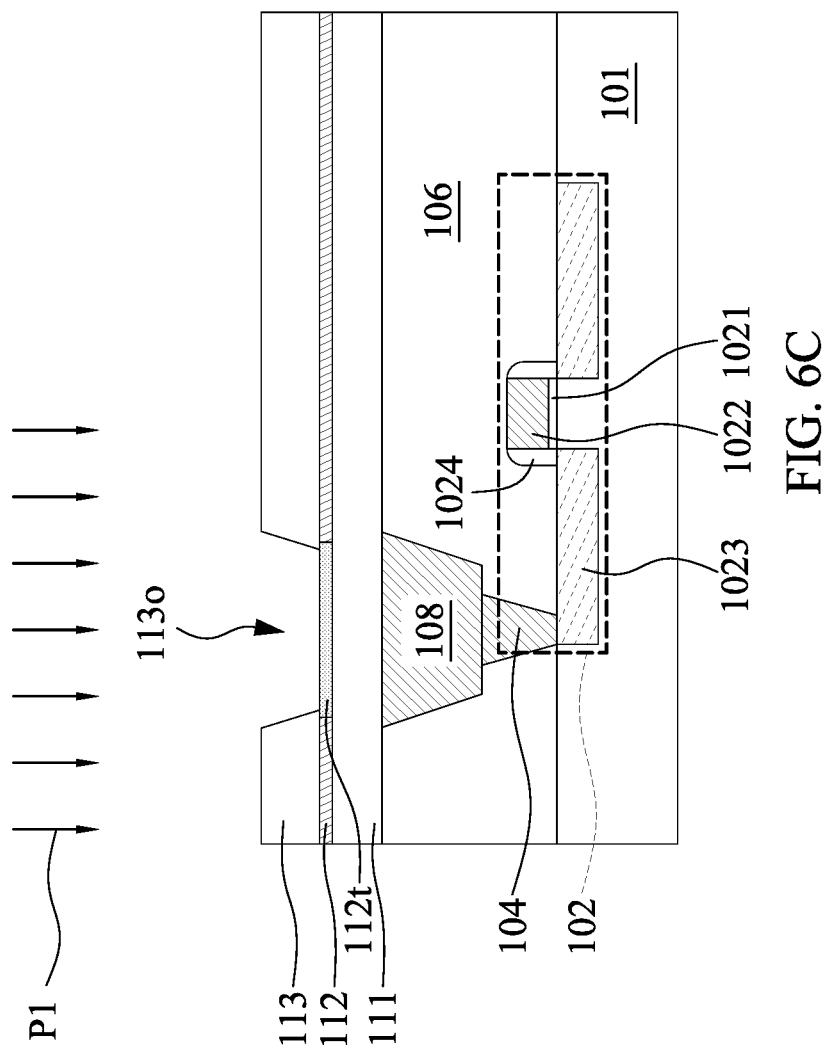

Referring to FIG. 6C, an etching process P1 is performed. In some embodiments, the etching process P1 may include dry etching, wet etching, or other suitable process. In some embodiments, the etching process P1 uses an etchant including a reaction gas of halogen, such as fluorine, chlorine, bromine, iodine, a compound thereof, or a combination thereof. In some embodiments, a portion of the dielectric layer 113 is removed, which thereby forms an opening 113o.

In some embodiments, the etching stop layer 112 reacts with the etchant to form a treated portion 112t of the etching stop layer 112. The treated portion 112t is exposed by the opening 113o. In some embodiments, the etching stop layer 112 includes a halogen-sensitive material. In some embodiments, the treated portion 112t of the etching stop layer 112 includes halide, or a derivative of halide, such as metal halide. In some embodiments, the treated portion 112t of the etching stop layer 112 may have a relatively strong resistance against the etchant than the dielectric layer 111 and the dielectric layer 113.

Figure 6D:
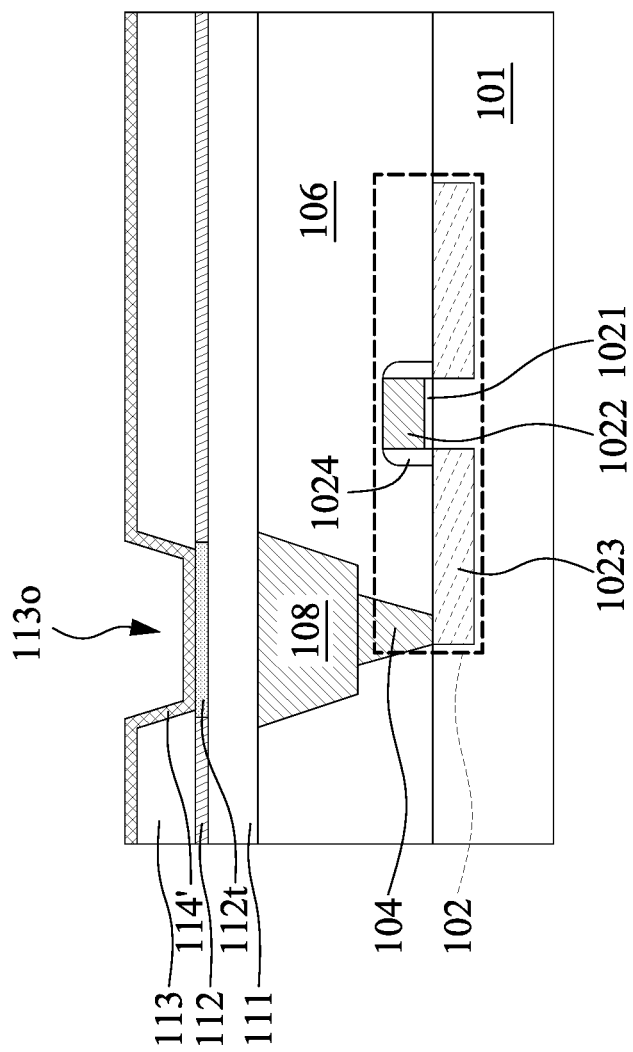

Referring to FIG. 6D, a dielectric material 114' is conformally on the dielectric layer 113 and on the etching stop layer 112 (or the treated portion 112t of the etching stop layer 112). In some embodiments, the liner 114 is formed by CVD, PVD, ALD, FCVD, or other suitable processes with a temperature ranging from 350° C. to about 550° C., such as 350° C., 400° C., 450° C., 500° C., or 550° C.

Figure 6E:
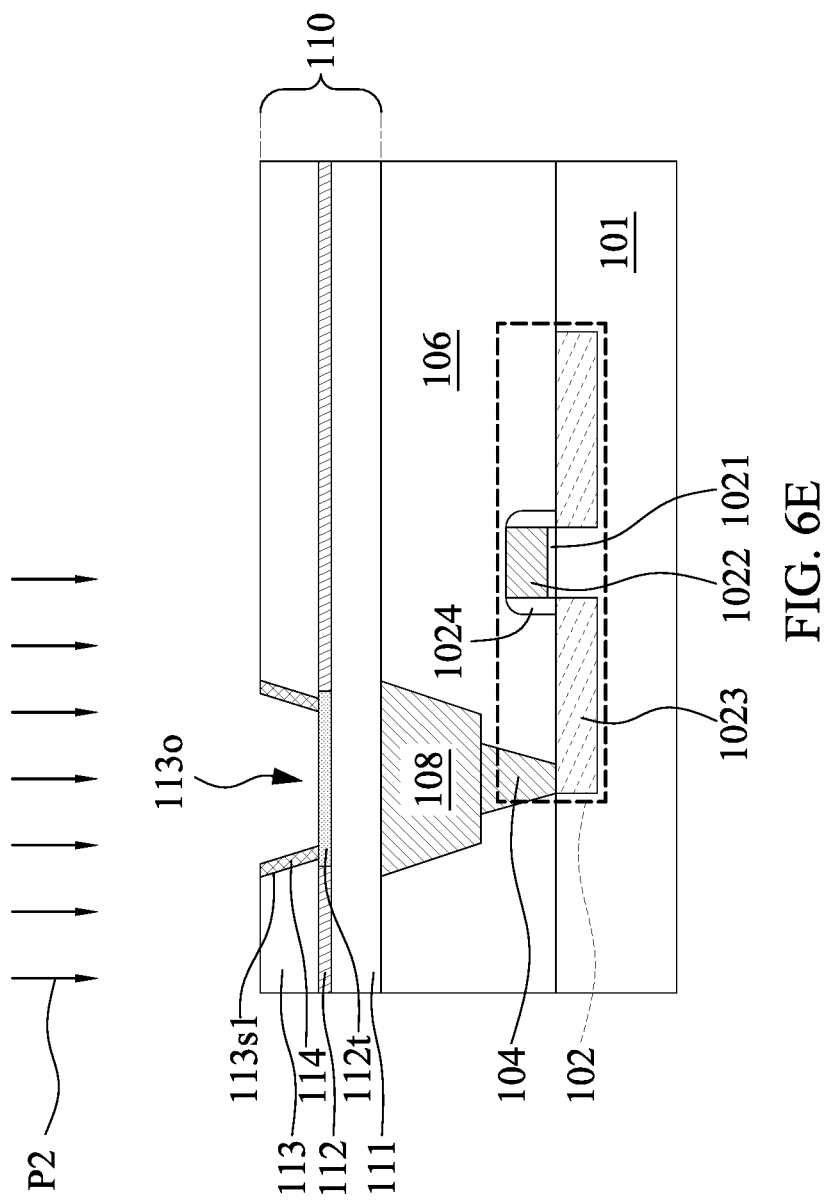

Referring to FIG. 6E, an etching process P2 is performed to remove a portion of the dielectric material 114', which thereby forms a liner 114 on a sidewall 113s1 of the dielectric layer 113. In some embodiments, the etching process P2 may include a dry etching, a wet etching, or other suitable etchings.

Figure 6F:
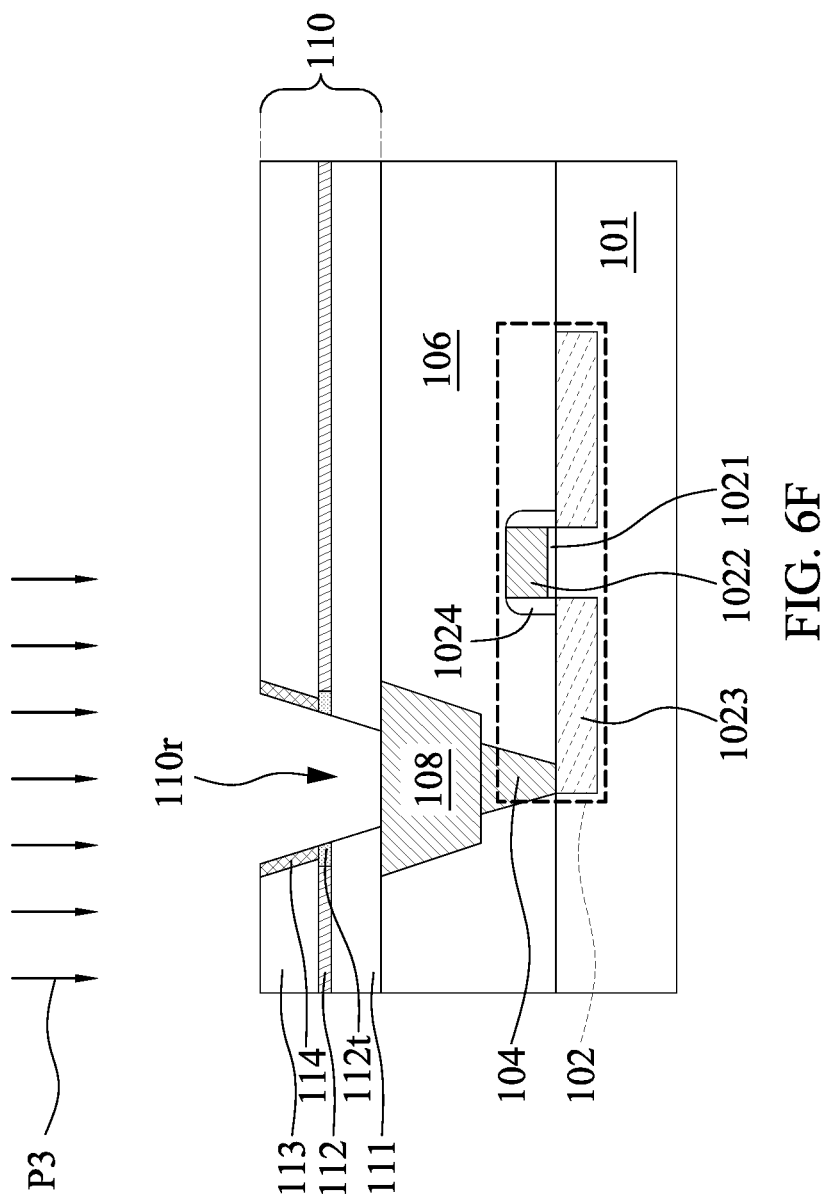

Referring to FIG. 6F, an etching process P3 is performed to remove a portion of the treated portion 112t and the dielectric layer 111, thereby forming an opening 110r of the dielectric structure 110. In some embodiments, the etching process P3 uses an etchant including amine, such as triethanolamine (TEA), polymethyldiethylenetriamine (PMDTA). In some embodiments, the etching process P3 uses an etchant which can include an ionic accelerating agent, such as ammonium bifluoride (ABF). In some embodiments, the etching process P3 uses a chelation agent iminodiacetic acid (IDA).

In an alternative embodiment, the dielectric material 114', the treated portion 112t, and the dielectric layer 111 may be removed by one etching process using the same equipment and chamber.

Figure 6G:
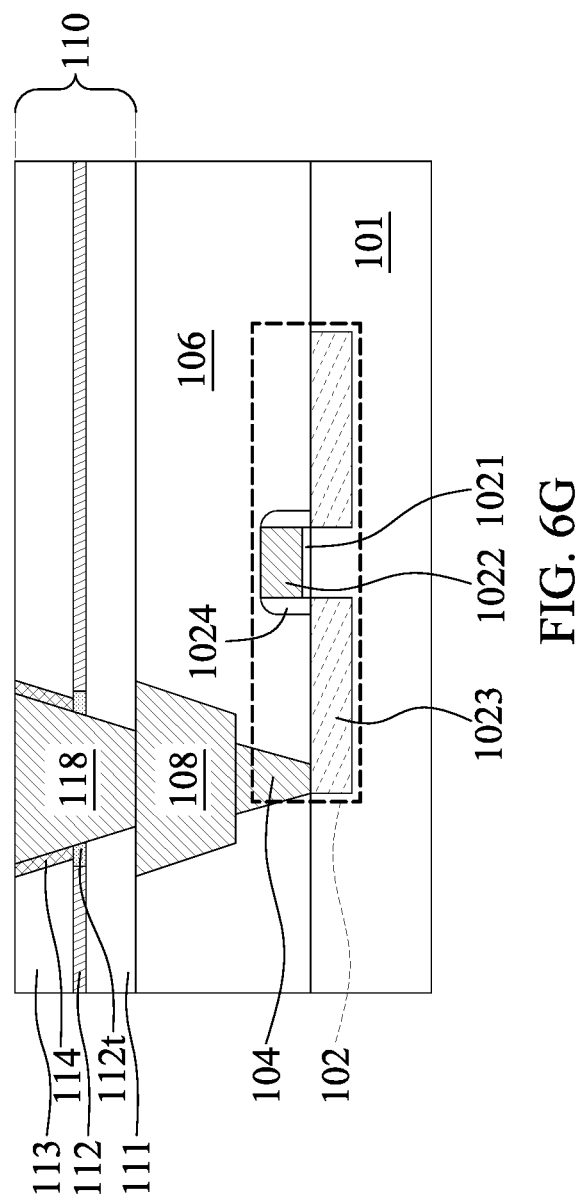

Referring to FIG. 6G, a conductive via 118 is formed within the opening 110r of the dielectric structure 110. The conductive via 118 may be formed by PVD, CVD, ALD, FCVD, or other suitable processes.

Figure 6H:
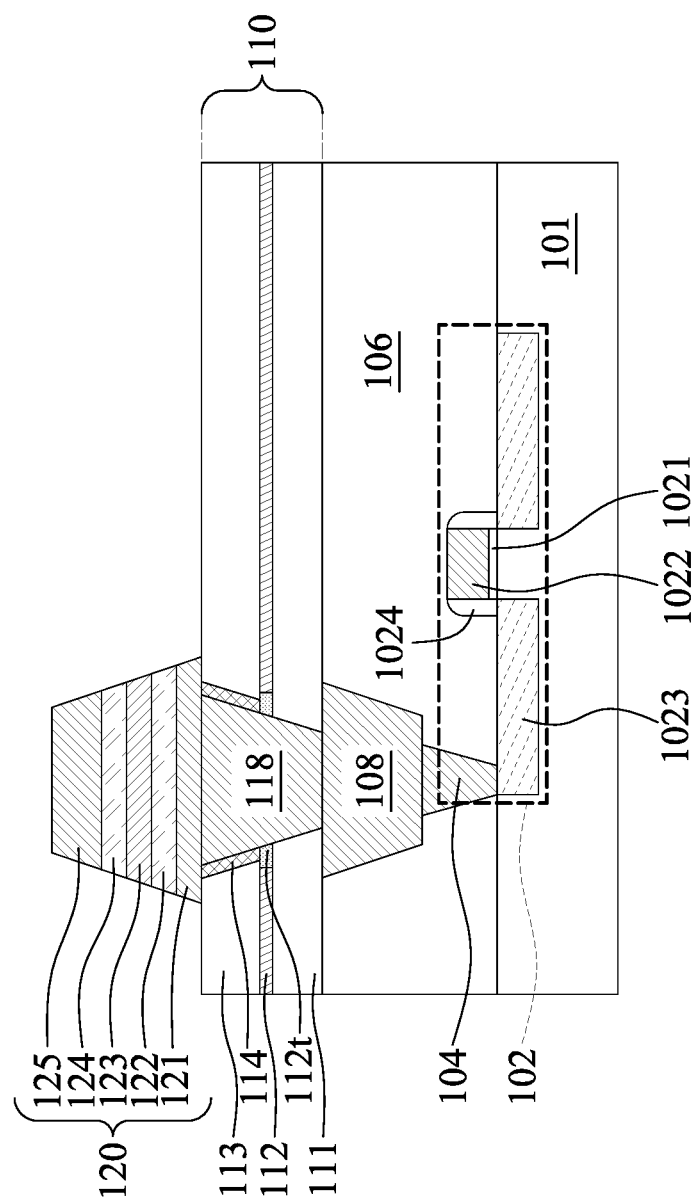

Referring to FIG. 6H, a data storage structure 120 is formed on the conductive via 118. In some embodiments, layers to form an electrode 121, a ferromagnetic electrode 122, a tunneling barrier layer 123, a ferromagnetic electrode 124, and an electrode 125 may be deposited in order, each of which may be formed by PVD, CVD, ALD, FCVD, or other suitable processes. Next, a patterned photoresist (not shown) layer is formed over the electrode 125 and an etching operation is carried out to pattern the data storage structure. To elaborate, a mask layer (not shown) exposing a desired MTJ pattern is formed over the electrode 125 for the ensuing data storage structure 120 formation. The mask layer may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, PVD, CVD, low-pressure chemical vapor deposition (LPCVD), PECVD, and the like. In some embodiments, the data storage structure 120 is formed by an RIE to have a trapezoidal cross section.

Figure 6I:
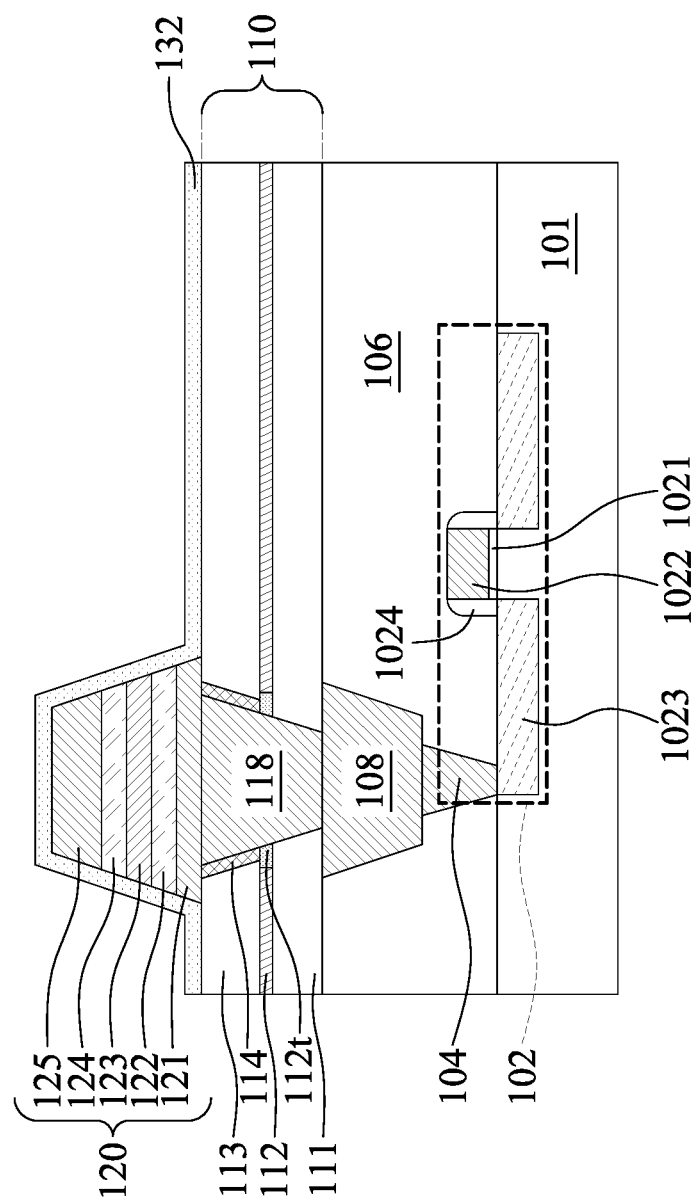

Referring to FIG. 6I, a spacer 132 is formed to cover the sidewall of the data storage structure 120 and the top surface of the dielectric structure 110. The spacer 132 may be formed by CVD, PVD, ALD, FCVD, or other suitable processes, and by suitable etching process to modify the profile of the spacer 132.

Figure 6J:
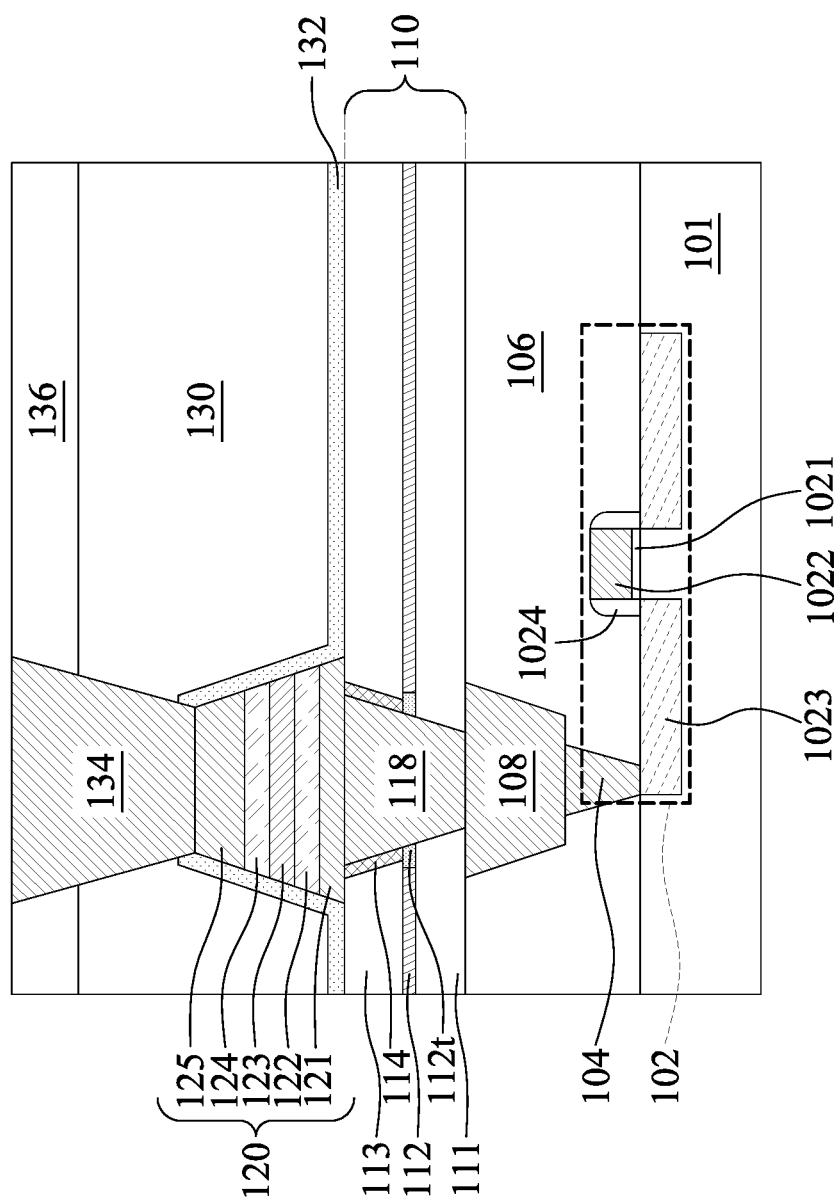

Referring to FIG. 6J, a dielectric layer 130, an interconnect wire 134, and a dielectric layer 136 are formed. In some embodiments, the dielectric layers 130 and the 136 are deposited in order. Next, a portion of the dielectric layer 130, the dielectric layer 136, and the spacer 132 are removed, thereby forming an opening. One or more conductive materials are deposited to fill the opening, thereby forming the interconnect wire 134.

Referring to FIG. 6K, a conductive via 138, a conductive wire 140, and a dielectric layer 142 are formed, which thereby produces the semiconductor device 100a. In some embodiments, the conductive wire 140 is deposited by CVD, PVD, ALD, FCVD, or other suitable processes. The conductive wire 140 and the conductive via 138 may be formed by way of damascene processes.

In this embodiment, an etching stop layer (e.g., 112) is formed to separate the lower dielectric layer (e.g., 111) from the upper dielectric layer (e.g., 113). Since the etching stop layer may have relatively stronger resistance to the etchant used in an etching process (e.g., P1). As a result, the lower dielectric layer may remain, which thereby ensures a sufficient thickness of the lower dielectric layer over the lower metal layer conductive via (e.g., 108). In such a condition, the lower metal layer conductive via can be prevented from an extrusion during forming a liner, which is under a process condition with a relatively large temperature. Therefore, the yield of manufacturing the semiconductor device 100a is improved.

Figure 7:
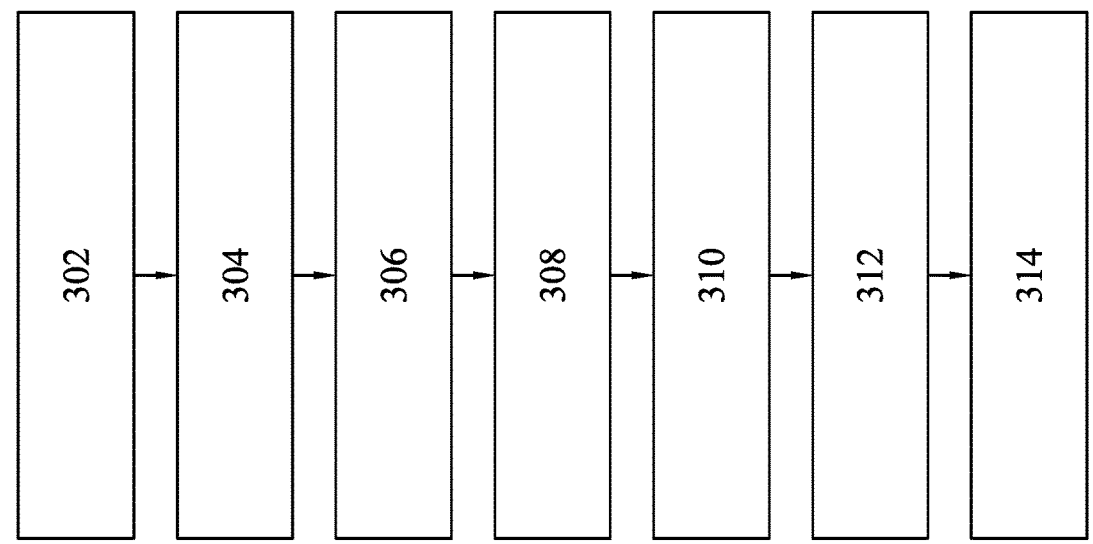
FIG. 7 is a flowchart of a method for manufacturing a semiconductor device according to various aspects of the present disclosure.
Figure 8:
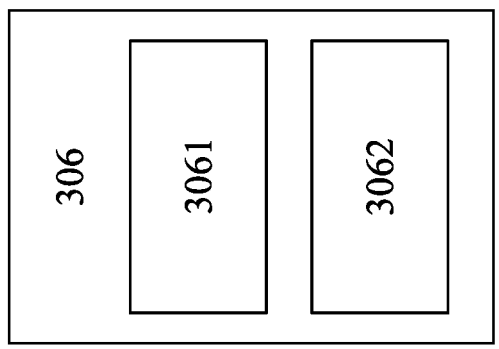
FIG. 8 is a flowchart of a method for manufacturing a semiconductor device according to various aspects of the present disclosure.

FIGS. 7 and 8 are flowcharts of a method 300 for manufacturing a semiconductor device according to various aspects of the present disclosure.

The method 300 begins with operation 302 in which a substrate is provided. A first ILD layer is formed over the substrate. A transistor is formed within the substrate and the first ILD layer. A conductive contact is formed to connect S/D regions of the transistor. An interconnection wire is formed over the conductive contact. FIG. 6A is a cross-sectional view corresponding to operation 302.

The method 300 continues with operation 304 in which a lower dielectric layer, an etching stop layer, and an upper dielectric layer are formed over the first ILD and/or the substrate. FIG. 6B is a cross-sectional view corresponding to operation 304.

The method 300 continues with operation 306 in which a portion of the upper dielectric layer is removed, and a treated portion of the etching stop layer is formed. As shown in FIG. 8, operation 306 includes operations 3061 and 3062.

Operation 3061 includes performing a first etching process to remove a portion of the upper dielectric layer. The first etching process uses an etchant include halogen.

Operation 3062 includes forming a treated portion of the etching stop layer. A portion of the etching stop layer exposed by the upper dielectric layer reacts with the etchant to form a treated portion of the etching stop layer. FIG. 6C is a cross-sectional view corresponding to operations 3061 and 3062.

The method 300 continues with operation 308 in which a liner is formed on a sidewall of the upper dielectric layer and on the treated portion of the etching stop layer. FIG. 6D is a cross-sectional view corresponding to operation 308.

The method 300 continues with operation 310 in which a portion of the liner, the treated portion of the etching stop layer, and the lower dielectric layer are removed. An opening defined by a dielectric structure is produced. FIG. 6E and FIG. 6F are cross-sectional views corresponding to operation 310.

The method 300 continues with operation 312 in which a bottom via is formed within the opening defined by the dielectric structure. A data storage structure is formed over the bottom via. A spacer is formed on the sidewall of the data storage structure and on the top surface of the dielectric structure. FIG. 6G, FIG. 6H, and FIG. 6I are cross-sectional views corresponding to operation 312.

The method 300 continues with operation 314 in which a second ILD layer, a third ILD layer, an upper interconnect wire, a conductive via, and a conductive wire are formed. As a result, a semiconductor device is formed. FIG. 6J and FIG. 6K are cross-sectional views corresponding to operation 312.

The method 300 is merely an example, and is not intended to limit the present disclosure beyond what is explicitly recited in the claims. Additional operations can be provided before, during, and after the method 300, and some operations described can be replaced, eliminated, or reordered for additional embodiments of the method.

Some embodiments of the present disclosure provide a semiconductor device. The semiconductor device includes a substrate, a first dielectric layer, an etching stop layer, a second dielectric layer, a conductive via, and a data storage structure. The first dielectric layer is disposed on the substrate. The etching stop layer is disposed on the first dielectric layer. The second dielectric layer is disposed on the etching stop layer. The first dielectric layer, the etching stop layer, and the second dielectric layer collectively define an opening. The conductive via is disposed in the opening. The data storage structure is disposed on the conductive via.

Some embodiments of the present disclosure provide a semiconductor device. The semiconductor device includes a substrate, a dielectric structure, a conductive via, and a data storage structure. The dielectric structure defines an opening. The dielectric structure includes a lower dielectric layer, an upper dielectric layer, and a liner. The upper dielectric layer is disposed on the lower dielectric layer. The liner is disposed on a sidewall of the upper dielectric layer. The conductive via is disposed within the opening of the dielectric structure. The data storage structure is disposed on the conductive via. A sidewall of the liner is substantially coplanar with a sidewall of the lower dielectric layer.

Some embodiments of the present disclosure provide a method of manufacturing a semiconductor device. The method includes providing a substrate, forming a first dielectric layer on the substrate, forming an etching stop layer on the first dielectric layer, forming a second dielectric layer on the etching stop layer, etching a portion of the second dielectric layer to expose the etching stop layer, forming a liner on the second dielectric layer and on the etching stop layer, removing a portion of the liner, the etching stop layer, and the first dielectric layer to form an opening, and forming a conductive via in the opening.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first dielectric layer disposed on the substrate;
   an etching stop layer disposed on the first dielectric layer;
   a second dielectric layer disposed on the etching stop layer, wherein the first dielectric layer, the etching stop layer, and the second dielectric layer collectively define an opening; and
   a conductive via disposed in the opening; and
   a data storage structure disposed on the conductive via, wherein the etching stop layer comprises a treated portion, and the treated portion comprises halide.

2. The semiconductor device of claim 1, further comprising:
   a liner disposed on a sidewall of the second dielectric layer, wherein a sidewall of the liner is substantially coplanar with a sidewall of the etching stop layer.

3. The semiconductor device of claim 2, wherein the first dielectric layer is spaced apart from the liner by the etching stop layer.

4. The semiconductor device of claim 2, wherein a roughness of the sidewall of the liner is different from a roughness of the sidewall of the etching stop layer.

5. The semiconductor device of claim 1, wherein the etching stop layer comprises a halogen-sensitive material.

6. The semiconductor device of claim 1, wherein the treated portion is exposed from the opening, and the treated portion comprises a composition different from that of the etching stop layer.

7. The semiconductor device of claim 1, wherein the treated portion of the etching stop layer comprises metal halide.

8. The semiconductor device of claim 1, wherein the conductive via has a first taper angle and a second taper angle different from the first taper angle.

9. The semiconductor device of claim 8, wherein the first taper angle is defined by a sidewall of the second dielectric layer, and the second taper angle is defined by a sidewall of the etching stop layer.

10. A semiconductor device, comprising:
    a substrate;
    a dielectric structure defining an opening, comprising:
      a lower dielectric layer;
      an upper dielectric layer disposed on the lower dielectric layer; and
      a liner disposed on a sidewall of the upper dielectric layer;
    a conductive via disposed within the opening of the dielectric structure, wherein the liner has a sidewall facing the conductive via; and
    a data storage structure disposed on the conductive via, wherein the sidewall of the liner is substantially coplanar with a sidewall of the lower dielectric layer.

11. The semiconductor device of claim 10, wherein a lower surface of the liner is located above an upper surface of the lower dielectric layer.

12. The semiconductor device of claim 10, wherein the dielectric structure further comprises an etching stop layer disposed between the upper dielectric layer and the lower dielectric layer.

13. The semiconductor device of claim 12, wherein the sidewall of the liner is substantially coplanar with a sidewall of the etching stop layer.

14. The semiconductor device of claim 12, wherein the etching stop layer comprises a halogen-sensitive material.

15. The semiconductor device of claim 12, wherein the etching stop layer comprises a treated portion having a composition different from that of the etching stop layer, and the treated portion of the etching stop layer is exposed from the opening of the dielectric structure.

16. The semiconductor device of claim 15, wherein a thickness of the treated portion of the etching stop layer is greater than a thickness of the liner along a lateral direction.

17. The semiconductor device of claim 15, wherein the liner decreases in thickness along a direction from the upper dielectric layer toward the lower dielectric layer.

18. A method of manufacturing a semiconductor device, comprising:
    providing a substrate;
    forming a first dielectric layer on the substrate;
    forming an etching stop layer on the first dielectric layer;
    forming a second dielectric layer on the etching stop layer;
    etching a portion of the second dielectric layer to expose the etching stop layer;
    forming a liner on the second dielectric layer and on the etching stop layer;
    removing a portion of the liner, the etching stop layer, and the first dielectric layer to form an opening; and
    forming a conductive via in the opening.

19. The method of claim 18, wherein etching the portion of the second dielectric layer comprises performing an etching process with an etchant, and the etchant reacts with the etching stop layer to form a treated portion.

20. The method of claim 19, wherein the etchant comprises halogen or a derivative of halogen, and the etching stop layer comprises a halogen-sensitive material.

* * * * *